US010014267B2

(12) United States Patent
Cho et al.

(10) Patent No.: US 10,014,267 B2
(45) Date of Patent: Jul. 3, 2018

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Yong-Sang Cho, Hwaseong-si (KR); Sang-Woo Pae, Seongnam-si (KR); Hyun-Suk Chun, Yongin-si (KR); Young-Seok Jung, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 24 days.

(21) Appl. No.: 15/145,231

(22) Filed: May 3, 2016

(65) Prior Publication Data

US 2016/0365326 A1   Dec. 15, 2016

(30) Foreign Application Priority Data

Jun. 12, 2015   (KR) .................. 10-2015-0083148

(51) Int. Cl.
  *H01L 23/00* (2006.01)
  *H01L 23/58* (2006.01)
  (Continued)

(52) U.S. Cl.
  CPC ............ *H01L 24/02* (2013.01); *H01L 23/585* (2013.01); *H01L 24/94* (2013.01);
  (Continued)

(58) Field of Classification Search
  CPC ....... H01L 23/585; H01L 24/94; H01L 24/02; H01L 23/525; H01L 2224/02381;
  (Continued)

(56) References Cited

U.S. PATENT DOCUMENTS 7,235,844 B2 *  6/2007  Itou .................. H01L 24/03
                                                257/341
8,017,515 B2    9/2011  Marimuthu et al.
              (Continued)

FOREIGN PATENT DOCUMENTS

KR        100915761 B1    9/2009
KR     2010-0093357 A    8/2010
              (Continued)

*Primary Examiner* — Latanya N Crawford
(74) *Attorney, Agent, or Firm* — Harness, Dickey & Pierce, P.L.C.

(57) ABSTRACT

A semiconductor device comprises a semiconductor chip which includes at least one gate structure on a substrate, the gate structure including a first region, a second region different from the first region, and a third region between the first and the second region, a first redistribution layer on a top surface of the semiconductor chip, the first redistribution layer configured to electrically connect a first electrode pad of the semiconductor chip to a first solder ball and overlap the first region of the gate structure, a second redistribution layer on the top surface of the semiconductor chip, the second redistribution layer configured to electrically connect a second electrode pad of the semiconductor chip to a second solder ball and overlap the second region of the gate structure such that the third region is exposed, and an insulating layer on the first redistribution layer and the second redistribution layer.

15 Claims, 8 Drawing Sheets

(51) Int. Cl.
*H01L 23/31* (2006.01)
*H01L 23/525* (2006.01)

(52) U.S. Cl.
CPC ......... *H01L 23/3114* (2013.01); *H01L 23/525* (2013.01); *H01L 24/05* (2013.01); *H01L 24/13* (2013.01); *H01L 2224/0235* (2013.01); *H01L 2224/0237* (2013.01); *H01L 2224/0239* (2013.01); *H01L 2224/02235* (2013.01); *H01L 2224/02379* (2013.01); *H01L 2224/02381* (2013.01); *H01L 2224/0401* (2013.01); *H01L 2224/05569* (2013.01); *H01L 2224/131* (2013.01); *H01L 2224/13024* (2013.01); *H01L 2224/94* (2013.01); *H01L 2924/01022* (2013.01); *H01L 2924/01028* (2013.01); *H01L 2924/01029* (2013.01); *H01L 2924/141* (2013.01); *H01L 2924/351* (2013.01)

(58) Field of Classification Search
CPC ........... H01L 2224/05569; H01L 24/05; H01L 2224/02235; H01L 2224/02379; H01L 2224/131; H01L 24/13; H01L 24/14; H01L 24/18; H01L 2224/94; H01L 2224/0239; H01L 2224/0237; H01L 2924/141; H01L 2924/01022; H01L 2924/351; H01L 2224/0235; H01L 2924/01029; H01L 23/3114; H01L 2224/13024; H01L 2924/01028; H01L 2224/0401
See application file for complete search history.

(56) References Cited

U.S. PATENT DOCUMENTS

| | | | | |
|---|---|---|---|---|
| 9,240,475 | B2* | 1/2016 | Kim | H01L 29/78 |
| 9,305,877 | B1* | 4/2016 | Yu | H01L 23/5226 |
| 2008/0142946 | A1 | 6/2008 | Yang et al. | |
| 2008/0211080 | A1 | 9/2008 | Yang et al. | |
| 2010/0096754 | A1 | 4/2010 | Lee et al. | |
| 2011/0108981 | A1 | 5/2011 | Rahim et al. | |
| 2012/0261813 | A1 | 10/2012 | Anderson et al. | |
| 2012/0329263 | A1 | 12/2012 | Chou et al. | |
| 2013/0075139 | A1* | 3/2013 | Wang | H01L 23/3192 174/257 |
| 2013/0084682 | A1 | 4/2013 | Lee et al. | |
| 2013/0119532 | A1 | 5/2013 | Lin et al. | |
| 2013/0228897 | A1* | 9/2013 | Chen | H01L 24/05 257/621 |
| 2013/0328191 | A1 | 12/2013 | Meyer et al. | |
| 2014/0061900 | A1 | 3/2014 | Park et al. | |
| 2014/0117424 | A1* | 5/2014 | Kim | H01L 29/78 257/288 |
| 2014/0167261 | A1 | 6/2014 | Topacio et al. | |
| 2014/0252603 | A1* | 9/2014 | Lee | H01L 23/481 257/737 |
| 2015/0021784 | A1* | 1/2015 | Lin | H01L 23/481 257/774 |
| 2015/0021785 | A1* | 1/2015 | Lin | H01L 23/481 257/774 |
| 2015/0235940 | A1* | 8/2015 | Chen | H01L 23/528 257/759 |
| 2016/0126324 | A1* | 5/2016 | Yu | H01L 29/402 257/503 |
| 2016/0218090 | A1* | 7/2016 | Yu | H01L 23/5226 |
| 2016/0379946 | A1* | 12/2016 | Maekawa | H01L 24/02 257/773 |
| 2017/0053896 | A1* | 2/2017 | Yu | H01L 21/76877 |

FOREIGN PATENT DOCUMENTS

| | | |
|---|---|---|
| KR | 2010-0131180 A | 12/2010 |
| KR | 2012-0006771 A | 1/2012 |
| KR | 2014-0029872 A | 3/2014 |

* cited by examiner

SEMICONDUCTOR DEVICE AND METHOD OF MANUFACTURING THE SAME

CROSS-REFERENCE TO RELATED APPLICATIONS

This application claims priority from Korean Patent Application No. 10-2015-0083148 filed on Jun. 12, 2015 in the Korean Intellectual Property Office, the disclosure of which is incorporated herein by reference in its entirety.

BACKGROUND

1. Field

Some example embodiments herein relate to a semiconductor device and/or a method of manufacturing that semiconductor device.

2. Description of the Related Art

Wafer level packaging (WLP) (or wafer fabricated packaging (WFP)) is a process of manufacturing an integrated circuit (IC) in a wafer state (a first process), packaging and conducting an electrical test on an IC (a second process), and then dividing the ICs into individual packages. The WLP process is different from a process of dividing the ICs in a wafer form into individual chips and then packaging the individual chips. In the WLP process, a redistribution layer may be used to electrically connect an electrode pad of a semiconductor chip to a solder ball which is an external contact terminal.

SUMMARY

Some example embodiments of the inventive concepts provide semiconductor device which can more easily change transistor characteristics of a semiconductor chip using a difference in coefficient of thermal expansion (CTE) between a redistribution layer and another layer of a wafer level package.

Other example embodiments of the inventive concepts also provide a method of manufacturing a semiconductor device which can more easily change transistor characteristics of a semiconductor chip using a difference in CTE between a redistribution layer and another layer of a wafer level package.

However, the present inventive concepts are not restricted to the ones set forth herein. The above present inventive concepts will become more apparent to one of ordinary skill in the art to which the present inventive concepts pertain by referencing the detailed description of the present inventive concepts given below.

According to some example embodiments a semiconductor device includes a semiconductor chip including at least one gate structure on a substrate, the gate structure including a first region, a second region which is different from the first region, and a third region between the first and the second region, a first redistribution layer on a top surface of the semiconductor chip, the first redistribution layer configured to electrically connect a first electrode pad of the semiconductor chip to a first solder ball and overlapping the first region of the gate structure, a second redistribution layer on the top surface of the semiconductor chip, the second redistribution layer configured to electrically connect a second electrode pad of the semiconductor chip to a second solder ball and overlapping the second region of the gate structure such that the third region is exposed, and an insulating layer on the first redistribution layer and the second redistribution layer.

In some example embodiments, coefficients of thermal expansion (CTEs) of the first redistribution layer and the second redistribution layer may be different from a CTE of the insulating layer.

In some example embodiments, the semiconductor chip may include a channel under the gate structure, and the first redistribution layer and the second redistribution layer may expand thermally in a same direction as the channel.

In some example embodiments, the semiconductor chip may include a transistor on the gate structure, and a charge mobility of the channel of the transistor varies according to a degree of the thermal expansion of the first redistribution layer and the second redistribution layer.

In some example embodiments, a threshold voltage of the transistor may vary according to the degree of the thermal expansion of the first redistribution layer and the second redistribution layer.

In some example embodiments, the semiconductor chip may further include a power management integrated circuit (PMIC) including a power supply circuit configured to generate an output voltage to be applied to other chips using the transistor on the gate structure, and the output voltage of the PMIC may vary according to a degree of thermal expansion of the first redistribution layer and the second redistribution layer.

In some example embodiments, the transistor may be one of a P-type transistor and an N-type transistor, and the output voltage may vary as the first redistribution layer and the second redistribution expand thermally.

In some example embodiments, the first redistribution layer and the second redistribution layer may be curved in one of a convex shape and a concave shape with respect to the gate structure.

In some example embodiments, the semiconductor chip may further include at least one metal wiring layer between the gate structure and the first and second redistribution layers, the metal wiring layer configured to reduce stress delivered to the gate structure from the first redistribution layer and the second redistribution layer.

In some example embodiments, the metal wiring layer may be a plurality of metal wiring layers forming a mesh.

According to other example embodiments, a semiconductor device includes a semiconductor chip which including at least one first gate structure and a second gate structure on a substrate extending along a first direction, the first gate structure having a top surface including a first overlap region, a second overlap region different from the first overlap region and a third overlap region between the first and second overlap region, a first redistribution layer covering the first overlap region in a second direction perpendicular to the first direction, and a second redistribution layer covering the entire top surface of the second gate structure and the second overlap region such that the third overlap region which is exposed.

In other example embodiments, the semiconductor device may further include a first transistor on the first gate structure and a second transistor on the second gate structure, wherein a thermal expansion of the first redistribution layer and the second redistribution layer changes a threshold voltage of the first transistor and keeps a threshold voltage of the second transistor constant.

In other example embodiments, the semiconductor device may further include an insulating layer on the first redistribution layer and the second redistribution layer, wherein the first redistribution layer and the second redistribution layer may expand thermally to a different degree from the insulating layer.

In other example embodiments, the first redistribution layer and the second redistribution layer may be configured to curve in a third direction perpendicular to the first direction and the second direction according to a difference between the degree of thermal expansion of the first and second redistribution layers and the degree of thermal expansion of the insulating layer, and the curved first and second redistribution layers may apply stress to the first gate structure.

In other embodiments, a width of the exposed region in the second direction may be smaller than a width of the top surface of the first gate structure in the second direction.

According to yet other example embodiments, a semiconductor chip includes at least one gate structure extending in a first direction on a substrate, at least one redistribution layer extending in a second direction on the substrate, the redistribution layer configured to electrically connect an electrode pad of the semiconductor chip to a solder ball, and an insulating layer on the redistribution layer, the redistribution layer having a different degree of thermal expansion than the insulating layer.

In yet other example embodiments, a top surface of the first gate structure may include first and second regions covered by the redistribution layer, the first and second regions spaced apart from each other, and an exposed region between the first region and the second region.

In yet other example embodiments, the redistribution layer may be curved in a third direction perpendicular to the first and second directions and may apply stress to the gate structure.

In yet other example embodiments, the semiconductor chip may further include a transistor on the gate structure, and a charge mobility in a channel of the transistor may vary according to the degree of thermal expansion of the redistribution layer.

In some example embodiments, the semiconductor chip may further include at least one metal wiring layer between the gate structure and the redistribution layer, the metal wiring layer configured to reduce stress delivered to the gate structure from the redistribution layer.

BRIEF DESCRIPTION OF THE DRAWINGS

The above and other features of the example embodiments of the present inventive concepts will become more apparent by describing in detail example embodiments thereof with reference to the attached drawings, in which.

DETAILED DESCRIPTION

Embodiments will be described in detail with reference to the accompanying drawings. The example embodiments of inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or"

includes any and all combinations of one or more of the associated listed items. Also, the term "example" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
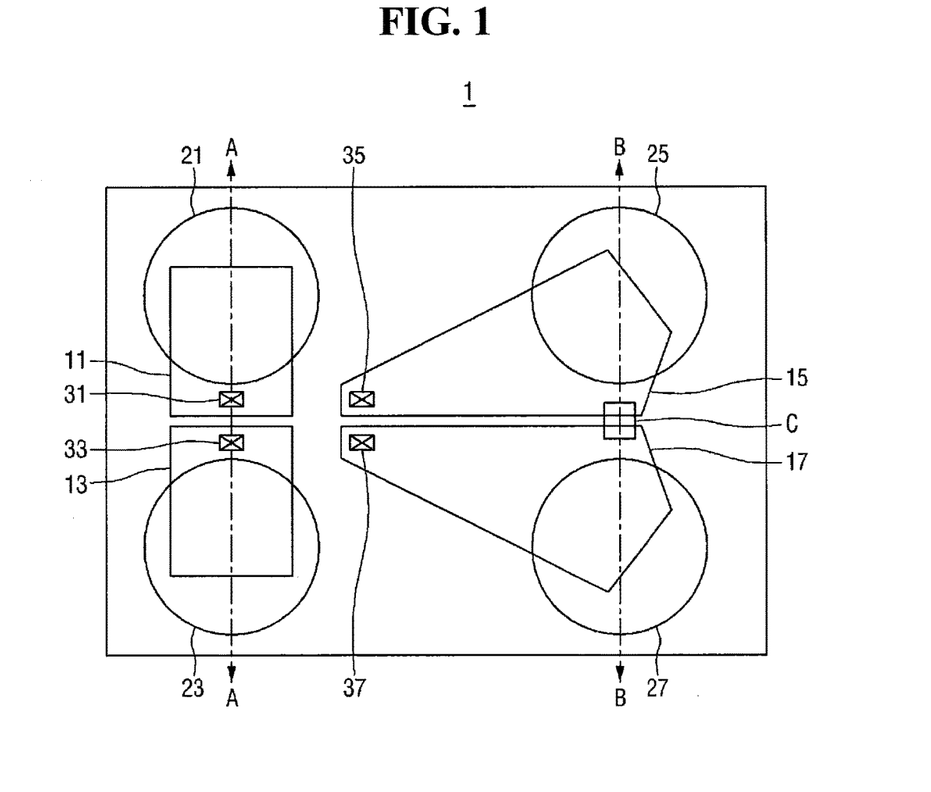
FIG. 1 is a layout view of a semiconductor device according to an example embodiment of the present inventive concepts.

FIG. 1 is a layout view of a semiconductor device 1 according to an example embodiment of the present inventive concepts.

Referring to FIG. 1, the semiconductor device 1 according to the current embodiment includes a package formed on a wafer including a plurality of integrated circuits (ICs).

The package is formed by a wafer level packaging (WIT) (or wafer fabricated packaging (WFP)) process. Specifically, the package is formed after an IC is formed on a wafer and before the IC in a wafer form is divided into individual semiconductor chips.

In the current embodiment, the package includes redistribution layers 11, 13, 15 and 17. Electrode pads 31, 33, 35 and 37 which form electrical contacts with an internal circuit of a semiconductor chip may be formed on a top surface of the semiconductor chip. Solder balls 3, 25 and 27 which serve as external contact terminals of the package may be formed on a top surface of the package.

The redistribution layers 11, 13, 15 and 17 electrically connect the electrode pads 31, 33, 35 and 37 to the solder balls 21, 23, 25 and 27, respectively, such that the internal circuit of the semiconductor chip can exchange electrical signals with other external electronic circuits of the package. For example, the redistribution layer 15 electrically connects the electrode pad 35 of the semiconductor chip and the solder ball 25 of the package which are separated from each other. An insulating layer may be formed on or under the redistribution layer 15 to reduce or prevent the redistribution layer 15 from contacting electrical conductive elements other than the electrode pad 35 and the solder ball 25. The detailed structure of the above package will be described in detail later with reference to FIG. 2A.

Figure 2A:
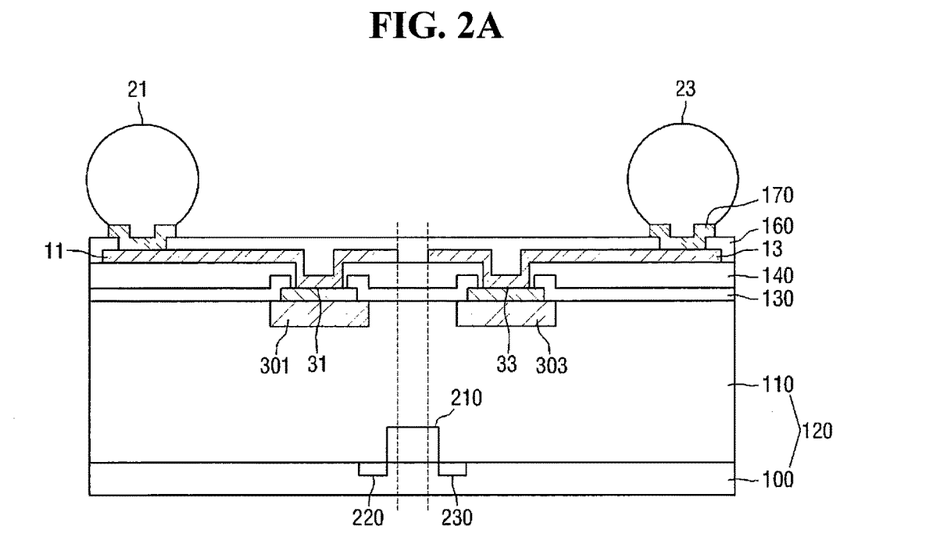
FIGS. 2A and 2B are cross-sectional views taken along the line A-A of FIG. 1.
Figure 2B:
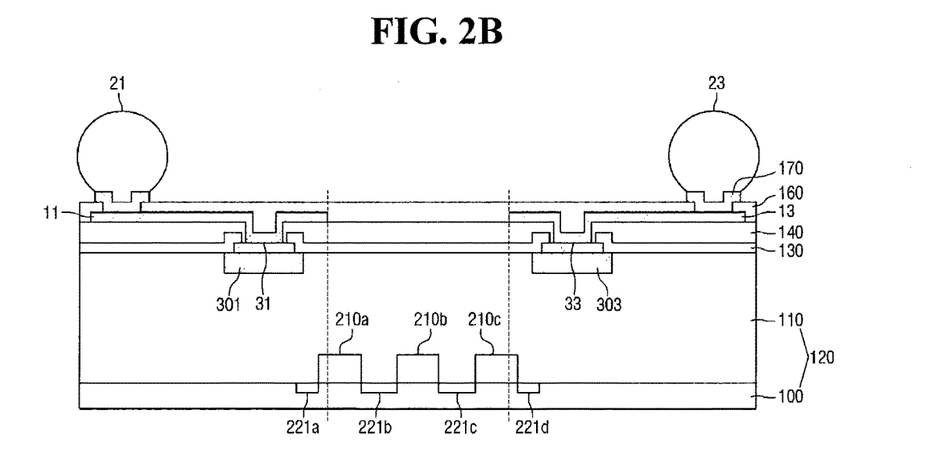

FIGS. 2A and 2B are cross-sectional views taken along the line A-A of FIG. 1.

Referring to FIG. 2A, the semiconductor device 1 according to the current embodiment may include a semiconductor chip 120, a passivation layer 130 formed on the semiconductor chip 120, a first insulating layer 140, the redistribution layers 11 and 13, a second insulating layer 160, under bump metallurgy (UBM) layers 170, and the solder balls 21 and 23. Here, the passivation layer 130, the first insulating layer 140, the redistribution layers 11 and 13, the second insulating layer 160, the UBM layers 170, and the solder balls 21 and 23 may constitute a package formed on the semiconductor chip 120. The semiconductor device 1 may further include the electrode pads 31 and 33 for electrical contact between the semiconductor chip 120 and the package.

The semiconductor chip 120 is a region where an IC is formed. The semiconductor chip 120 may include a lower semiconductor layer 100 and an upper semiconductor layer 110.

The lower semiconductor layer 100 may be a substrate for forming a transistor. For example, the lower semiconductor layer 100 may include active regions 220 and 230 for forming a transistor. Here, each of the active regions 220 and 230 may be a source region or a drain region.

The upper semiconductor layer 110 may be a circuit formation region where an IC circuit is implemented to extend from transistors formed on the lower semiconductor layer 100 (e.g., the substrate). The upper semiconductor layer 110 may include various elements such as a gate structure 210 for forming a transistor, a wiring layer (e.g., the metals 301 and 303) which electrically connects various semiconductor elements required for a circuit to be implemented, a contact, a via, and an insulating layer. For example, the upper semiconductor layer 110 may include metal 1, metal 2, metal 3 and metal 4 for electrical contact among circuit elements. For example, in FIG. 2A, the upper semiconductor layer 110 may include metals 301 and 303, and the metals 301 and 303 may be implemented as, for example, metal 4.

The electrode pads 31 and 33 are formed on the top surface of the semiconductor chip 120 such that they can be electrically connected to wiring layers (e.g., the metals 301 and 303) inside the semiconductor chip 120, In some example embodiments of the present inventive concepts, the electrode pads 31 and 33 may include metal, for example, aluminum (Al).

The passivation layer 130 may be formed on the top surface of the semiconductor chip 120 excluding the electrode pads 31 and 33. In some example embodiments of the present inventive concepts, the passivation layer 130 may include nitride or oxide. In particular, in the current embodiment, the passivation layer 130 may cover edges of the electrode pads 31 and 33 in order to protect the semiconductor chip 120.

The first insulating layer 140 is formed on the passivation layer 130. The first insulating layer 140 may insulate the redistribution layers 11 and 13, which electrically connect the electrode pads 31 and 33 to the solder balls 21 and 23, from other elements. In some example embodiments of the present inventive concepts, the first insulating layer 140 may be made of a polymer material such as photosensitive polyimide (PSPI), benzocyclobutene (BCB), or epoxy. Here, part of the PSPI layer formed, for example, deposited on the electrode pads 31 and 33 may be removed to expose the electrode pads 31 and 33 of the semiconductor chip 120. In particular, in the current example embodiment, the first insulating layer 140 may cover the passivation layer 130 which covers the edges of the electrode pads 31 and 33.

The redistribution layers 11 and 13 are formed on the first insulating layer 140. Respective ends of the redistribution layers 11 and 13 form electrical contacts with the electrode pads 31 and 33 of the semiconductor chip 120, and the other respective ends of the redistribution layers 11 and 13 form electrical contacts with the solder balls 21 and 23 through the UBM layers 170. Since the redistribution layers 11 and 13 function as interconnection layers for forming electrical contacts, they are made of a material having relatively high electrical conductivity. For example, the redistribution layers 11 and 13 may include titanium (Ti), copper (Cu), or nickel (Ni). In some example embodiments of the present inventive concepts, each of the redistribution layers 11 and 13 may be formed as a thin film having several types of metals deposited in order to secure superior electrical conductivity, adhesion and protection.

The second insulating layer 160 is formed on the redistribution layers 11 and 13 to insulate the redistribution layers 11 and 13 from other elements and protect the redistribution layers 11 and 13. In some example embodiments of the present inventive concepts, the second insulating layer 160, like the first insulating layer 140, may be made of various polymer materials. Here, unlike the first insulating layer 140, the second insulating layer 160 may not be removed in regions that overlap the electrode pads 31 and 33 but may be removed in regions for forming the UBM layers 170.

The UBM layers 170 are formed on exposed regions of the redistribution layers 11 and 13 and edges of the second insulating layer 160 to form electrical contacts with the redistribution layers 11 and 13 exposed between regions of the second insulating layer 160. The solder balls 21 and 23 are formed on the UBM layers 170 and electrically connected to the semiconductor chip 120 by the redistribution layers 11 and 13.

In the current embodiment, particular attention should be paid to the vertical positional relationship between the gate structure 210 formed inside the semiconductor chip 120 and ends of the redistribution layers 11 and 13 separated from each other. Specifically, in FIG. 2A, a left region (a first region) of the gate structure 210 is overlapped by the redistribution layer 11, and a right region (a second region) of the gate structure 210 is overlapped by the redistribution layer 13. In addition, a middle region (a third region) between the first region and the second region is not overlapped by the redistribution layers 11 and 13. That is, the third region is exposed between the redistribution layers 11 and 13.

While only one gate structure 210 is illustrated in FIG. 2A to concisely describe characteristics of the present inventive concepts, the scope of the present inventive concepts is not limited thereto. In some example embodiments of the present inventive concepts, a plurality of transistors formed on one or more gate structures may be disposed under separate regions of the redistribution layers 11 and 13. In addition, in some example embodiments of the present inventive concepts, the separate regions of the redistribution layers 11 and 13 may overlap the first region and the second region or the second region and the third region. That is, various modified examples can be included in the scope of the present inventive concepts as long as the separate regions of the redistribution layers 11 and 13 overlap a part of a channel region of a transistor formed under the separate regions.

For example, referring to 2B, one or more gate structures 210a through 210c may be formed under the separate regions of the redistribution layers 11 and 13, and active regions 221a through 221d may be formed around the gate structures 210a through 210c. Here, a left region of the gate structure 210a may be overlapped by the redistribution layer 11, and a right region of the gate structure 210c may be overlapped by the redistribution layer 13. A middle region between the first region and the second region may not be overlapped by the redistribution layers 11 and 13.

Referring back to FIG. 2A, other elements that form the package with the redistribution layers 11 and 13 have different coefficients of thermal expansion (CTEs) from the redistribution layers 11 and 13. For example, CTEs of the redistribution layers 11 and 13 may be different from those of the first insulating layer 140 and the second insulating layer 160. Accordingly, the redistribution layers 11 and 13 may thermally expand to a different degree from the first insulating layer 140 and the second insulating layer 160 in response to heat applied to the package including the redistribution layers 11 and 13 and the first and second insulating layers 140 and 160.

For example, assuming that the first insulating layer 140 and the second insulating layer 160 are formed as PSPI layers and that the redistribution layers 11 and 13 are formed as Cu layers, the CTEs of the first insulating layer 140 and the second insulating layer 160 may be greater than those of the redistribution layers 11 and 13. In this case, the magnitude of stress or strain on the first insulating layer 140 and the second insulating layer 160 may be smaller than that of stress or strain on the redistribution layers 11 and 13 in view of Young's modulus. That is, the redistribution layers 11 and 13 formed as Cu layers may have greater stress than the first insulating layer 140 and the second insulating layer 160 formed as PSPI layers.

TABLE 1

|  | Thickness [μm] | Young's Ratio [Gpa] | CTE [ppm] |
| --- | --- | --- | --- |
| Second PSPI layer | 10 | 3.3 | 45.0 |
| Redistribution layer | 6.00 | 110.0 | 16.5 |
| First PSPI layer | 8.00 | 3.3 | 45.0 |

Table 1 shows an example of stresses due to the difference in thermal expansion between the first and second insulating layers 140 and 160 and the redistribution layers 11 and 13. Values shown in Table 1 have been obtained under particular conditions, for example, under particular thickness conditions of the first and second insulating layers 140 and 160 and the redistribution layers 11 and 13, and the scope of the present inventive concepts is not limited thereto. In particular, the values of Table 1 may denote not only the values shown but also approximate values within a particular range.

Referring to Table 1, a first PSPI layer corresponding to the first insulating layer 140 and a second PSPI layer corresponding to the second insulating layer 160 have CTEs of, 45.0 ppm, whereas a redistribution layer has a CTE of, e.g., 16.5 ppm. That is, the redistribution layer may thermally expand to a different degree from the first PSPI layer and the second PSPI layer in response to heat applied to a package including the first PSPI layer, the redistribution layer and the second PSPI layer. In this case, each of the first PSPI layer and the second PSPI layer may have a stress of, e.g., 3.3 Gpa, whereas the redistribution layer has a stress of, e.g., 110.0 Gpa. That is, the difference in the degree of thermal expansion due to the difference in CTE can cause the difference in stress.

If the redistribution layers 11 and 13 and the first and second insulating layers 140 and 160 thermally expand at different rates, the redistribution layers 11 and 13 may be curved. The redistribution layers 11 and 13 and the first and second insulating layers 140 and 160 may have various thicknesses according to the implementation purpose of the semiconductor device. Depending on the thicknesses of the redistribution layers 11 and 13 and the first and second insulating layers 140 and 160, the redistribution layers 11 and 13 may be curved downward toward the semiconductor chip 120 or the gate structure 210 or, conversely, may be curved upward.

The curved redistribution layers 11 and 13 apply stress to a transistor formed on the gate structure 210 thereunder, and the applied stress affects charge mobility in a channel of the transistor. In other words, the charge mobility in the channel of the transistor formed on the gate structure 210 under the separate regions of the redistribution layers 11 and 13 varies according to the degree of thermal expansion of the redistribution layers 11 and 13. This indicates that a channel current $I_{DS}$ or threshold voltage of the transistor can vary according to the degree of thermal expansion of the redistribution layers 11 and 13.

Therefore, according to the current embodiment of the present inventive concepts, after a package of a semiconductor chip is formed, a heat treatment process is performed on the package, thereby easily changing current-voltage characteristics of a transistor of the packaged semiconductor chip. In addition, in a WLP process, a packaged wafer is heat-treated before being divided into individual semiconductor chips. Therefore, the current-voltage characteristics of transistors of a large number of semiconductor chips can be changed simultaneously to customize the semiconductor chips according to the purpose of use.

Figure 3:
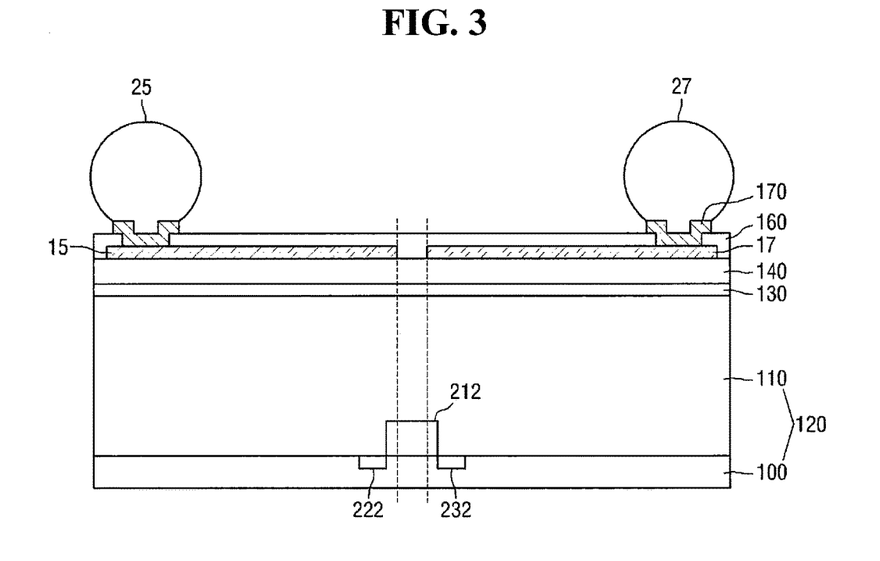
FIG. 3 is a cross-sectional view taken along the line B-B of FIG. 1.

FIG. 3 is a cross-sectional view taken along the line B-B of FIG. 1.

Referring to FIG. 3 together with FIG. 1, FIG. 3 is different from FIG. 2A in that the electrode pads 35 and 37 formed on the semiconductor chip 120 are not shown in the cross-section of FIG. 3. That is, even if a gate structure 212 is not adjacent to the electrode pads 35 and 36, the effect described in FIG. 2A can be obtained as long as the vertical positional relationship between the gate structure 212 and ends of the redistribution layers 15 and 17 separated from each other is satisfied.

For example, a left region (a first region) of the gate structure 212 is overlapped by the redistribution layer 15, and a right region (a second region) of the gate structure 212 is overlapped by the redistribution layer 17. In addition, a middle region (a third region) between the first region and the second region is not overlapped by the redistribution layers 15 and 17. That is, the third region is exposed between the redistribution layers 15 and 17. In this structure, a heat treatment process performed on the wafer having the package causes the redistribution layers 15 and 17 and the second insulating layer 160 to thermally expand at different rates. As a result, the redistribution layers 15 and 17 are curved downward toward, e.g., the semiconductor chip 120 or the gate structure 212.

Accordingly, the curved redistribution layers 15 and 17 apply stress to a transistor formed on the gate structure 212 thereunder, and the applied stress affects charge mobility in a channel of the transistor.

Figure 4:
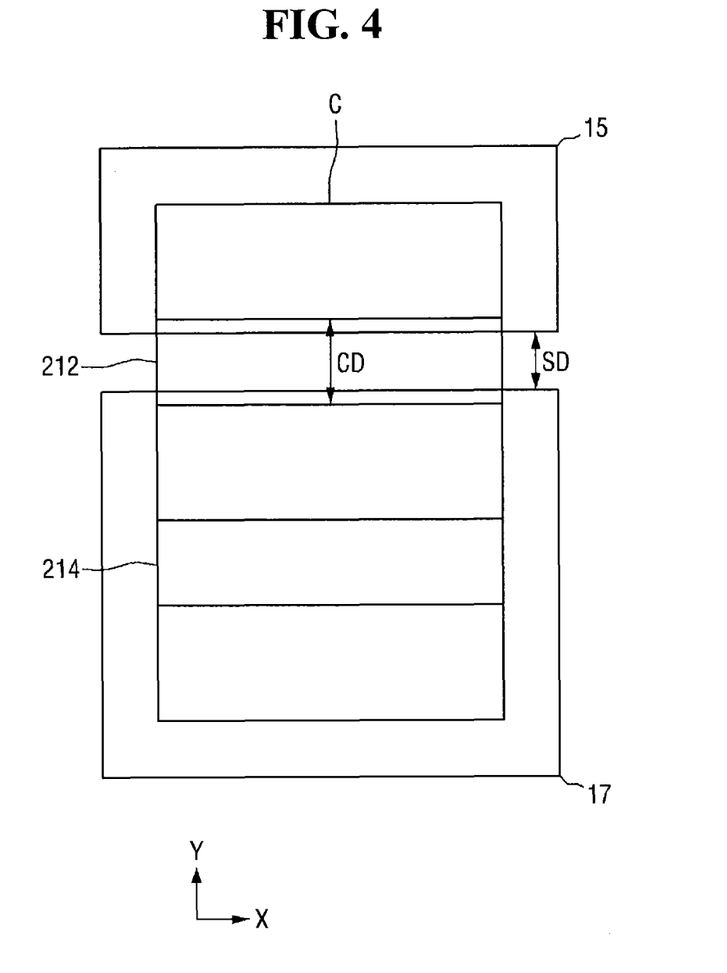
FIG. 4 is an enlarged view of a region 'C' of FIG. 1.

FIG. 4 is an enlarged view of a region 'C' of FIG. 1. In addition, FIG. 4 is a top view of FIG. 3.

Referring to FIG. 4, the semiconductor device 1 includes the semiconductor chip 120 which includes the first gate structure 212 and a second gate structure 214 formed on the substrate to extend along a first direction X. Here, an active region, for example, a source region or a drain region may be formed between the first gate structure 212 and the second gate structure 214.

The redistribution layer 15 may be formed on the top surface of the semiconductor chip 120 and cover a part of a top surface of the first gate structure in a second direction Y perpendicular to the first direction X. The redistribution layer 17 may be formed on the top surface of the semiconductor chip 120 and cover another part of the top surface of the first gate structure 212 in the second direction Y and the entire top surface of the second gate structure 214.

Accordingly, the top surface of the first gate structure 212 is divided into a first overlap region which is overlapped by the redistribution layer 15, a second overlap region which is overlapped by the redistribution layer 17, and a middle region between the first overlap region and the second overlap region. Here, the middle region between the first overlap region and the second overlap region is a region (i.e., an exposed region) which is not overlapped by the redistribution layers 15 and 17. A width of the exposed region in the second direction Y may be smaller than a width of the top surface of the first gate structure 212 in the second direction Y.

In the current embodiment, it should be particularly noted that a direction SD in which the redistribution layers 15 and 17 expand thermally is the same as a direction CD of a channel formed under the first gate structure 212. However, the scope of the present inventive concepts is not limited thereto. Advantageous effects of the present inventive concepts are maximized as the thermal expansion direction SD and the channel direction CD become more parallel to each other and reduced as the thermal expansion direction SD and the channel direction CD become more perpendicular to each other. Thus, the thermal expansion direction SD and the channel direction CI) can also be oblique to each other.

Figure 5A:
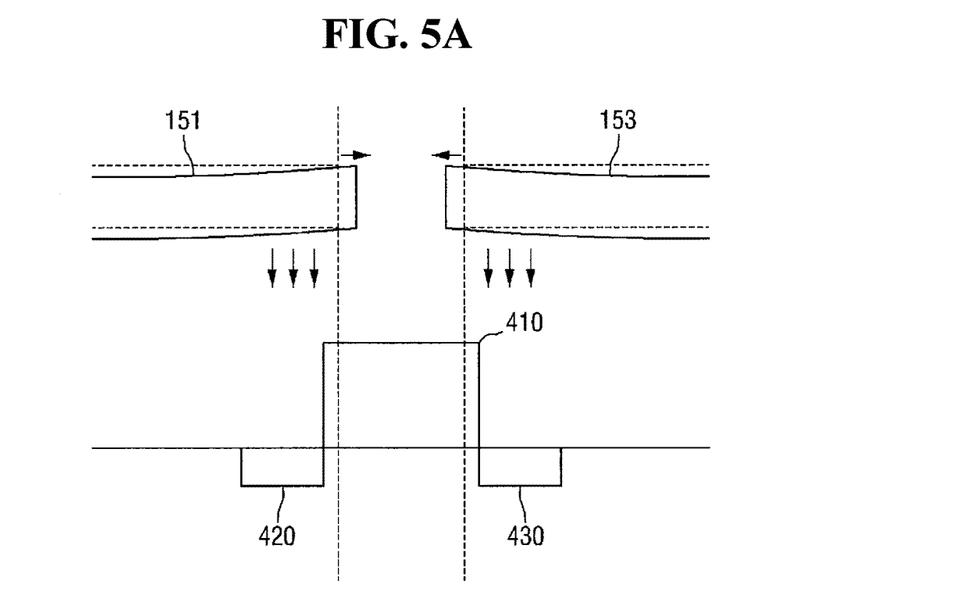
FIGS. 5A and 5B are cross-sectional views of a semiconductor device according to an example embodiment of the present inventive concepts.
Figure 5B:
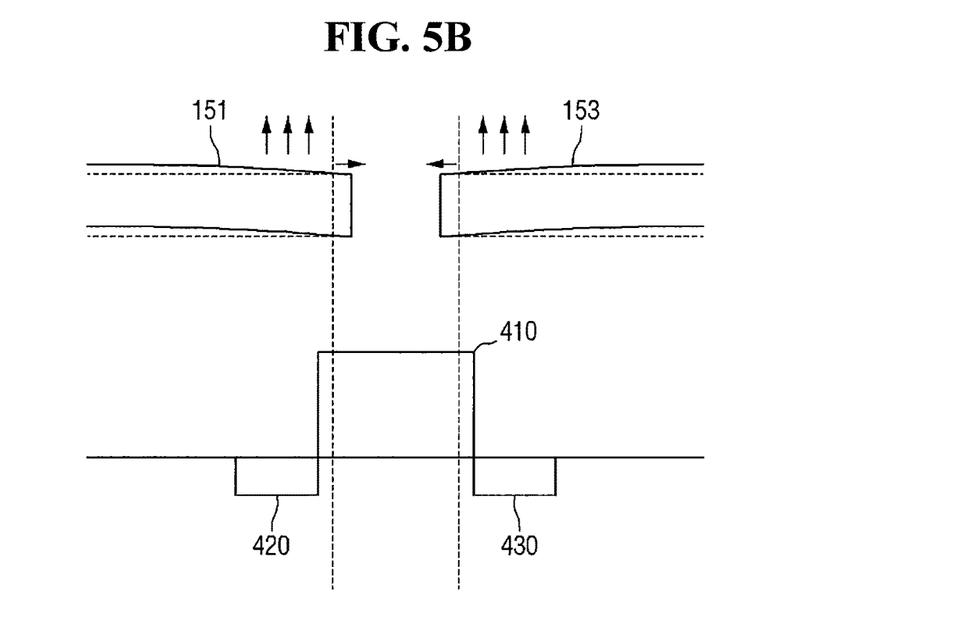

FIGS. 5A and 5B are cross-sectional views of a semiconductor device according to an example embodiment of the present inventive concepts.

Referring to FIG. 5A, curved redistribution layers 151 and 153 apply stress to a transistor formed on a gate structure 410. The difference in thermal expansion between an insulating layer disposed on and under the redistribution layers 151 and 153 and the redistribution layers 151 and 153 may cause the redistribution layers 151 and 153 to become adjacent to each other and curved downward toward the gate structure 410, that is, curved in a concave shape with respect to the gate structure 410. On the other hand, referring to FIG. 5B, in some example embodiments of the present inventive concepts, specific thicknesses of the redistribution layers 151 and 153 and the insulating layer disposed on and under the redistribution layers 151 and 153 may cause the redistribution layers 151 and 153 to become adjacent to each other and curved upward in a direction away from the gate structure 410, that is, curved in a convex shape with respect to the gate structure 410. In some example embodiments of the present inventive concepts, a direction in which the redistribution layers 151 and 153 thermally expand horizontally may be the same as a direction of a channel formed between active regions 420 and 430 under the gate structure 410.

Figure 6:
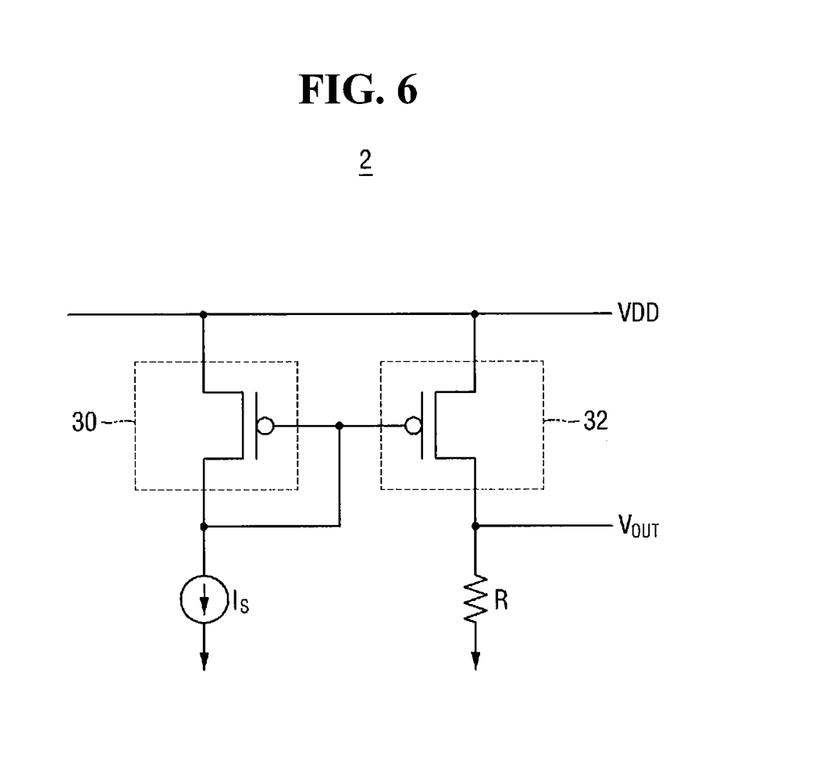
FIG. 6 is a circuit diagram of a semiconductor device according to another example embodiment of the present inventive concepts.
Figure 7:
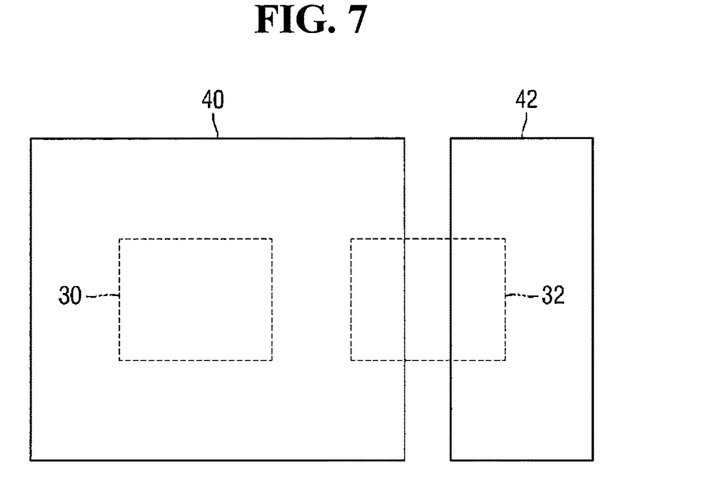
FIG. 7 is a layout view of the semiconductor device according to another example embodiment of the present inventive concepts.

FIG. 6 is a circuit diagram of a semiconductor device 2 according to another example embodiment of the present inventive concepts. FIG. 7 is a layout view of the semiconductor device 2 according to another example embodiment of the present inventive concepts.

Referring to FIG. 6, the semiconductor device 2 according to the current embodiment may include a circuit that outputs a certain output voltage using two transistors gated to the some input voltage. In some example embodiments of the present inventive concepts, the circuit may be a power supply circuit, which generates an output voltage to be applied to other chips, in a power management IC (PMIC) which supplies power to other chips. In the current embodiment, the two transistors gated to the same input voltage may include a first transistor 32 and a second transistor 30.

Referring to FIG. 7, as in FIG. 4, redistribution layers 40 and 42 may be formed on the first transistor 32 and the second transistor 30. That is, the redistribution layer 42 may be formed on the first transistor 32 to cover a part of a top surface of a gate structure that forms the first transistor 32.

The redistribution layer 40 may be formed on the first transistor 32 and the second transistor 30 to cover another part of the top surface of the gate structure that forms the first transistor 32 and the entire top surface of the gate structure that forms the second transistor 30.

Then, a heat treatment process may be performed on a packaged wafer having the first transistor 32 and the second transistor 30, thereby changing the charge mobility or threshold voltage of the first transistor 32. In an example, if the first transistor 32 is a P-type transistor, the thermal expansion of the redistribution layers 40 and 42 by the heat treatment process may cause the threshold voltage of the first transistor 32 to fall, thereby raising an output voltage $V_{OUT}$ of the power supply circuit. In another example, if the transistor 32 is an N-type transistor, the thermal expansion of the redistribution layers 40 and 42 by the heat treatment process may cause the threshold voltage of the first transistor 32 to rise, thereby lowering the output voltage $V_{OUT}$ of the power supply circuit. Meanwhile, the second transistor 30 completely covered by the redistribution layer 40 may not be affected by the heat treatment process. Thus, the threshold voltage of the second transistor 30 may remain constant.

As described above, according to the current example embodiment of the present inventive concepts, after a package of a semiconductor chip is formed, a heat treatment process is performed on the package, thereby easily changing current-voltage characteristics of a transistor of the packaged semiconductor chip. In addition, in a WIT process, a packaged wafer is heat-treated before being divided into individual semiconductor chips. Therefore, the current-voltage characteristics of transistors of a large number of semiconductor chips can be changed simultaneously to customize the semiconductor chips according to the purpose of use.

Figure 8:
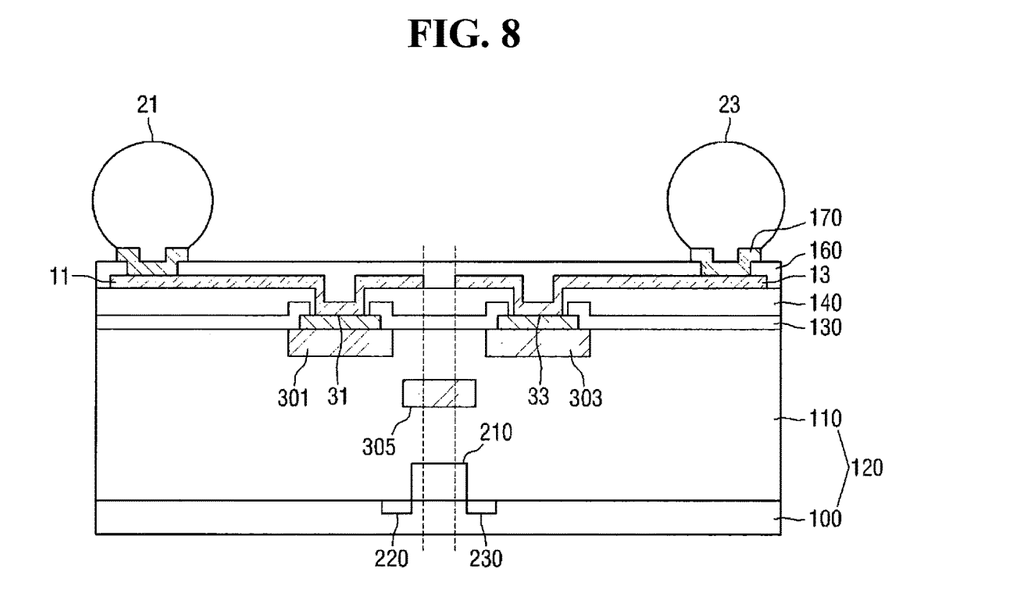
FIG. 8 is a cross-sectional view of a semiconductor device according to another example embodiment of the present inventive concepts.

FIG. 8 is a cross-sectional view of a semiconductor device according to another example embodiment of the present inventive concepts.

Referring to FIG. 8, the current embodiment is different from the embodiment of FIG. 2A in that a metal wiring layer 305 is further formed between a gate structure 210 and redistribution layers 11 and 13. The metal wiring layer 305 is formed between the gate structure 210 and the redistribution layers 11 and 13 to reduce or prevent a change in charge mobility due to the vertical positional relationship between the gate structure 210 and the redistribution layers 11 and 13.

For example, if thermal stability of a semiconductor chip needs to be maximized according to the implementation purpose of the semiconductor chip, a change in charge mobility due to the vertical positional relationship between the gate structure 210 and the redistribution layers 11 and 13 is not desirable. In particular, the semiconductor chip cannot only be heat-treated in a wafer form before being divided into individual chips but also be self-heated during real use after being mass-produced into products. In this case, the metal wiring layer 305 may be formed between the gate structure 210 and the redistribution layers 11 and 13 in order not to deliver the effect obtained by the thermal expansion of the redistribution layers 11 and 13 to a transistor formed thereunder.

In FIG. 8, the metal wiring layer 305 is illustrated as a single layer. In some other embodiments of the present inventive concepts, the metal wiring layer 305 may include a plurality of metal wiring layers arranged in a vertical direction or a horizontal direction as will be obvious to those of ordinary skill in the art to which the present inventive concepts pertain.

Figure 9:
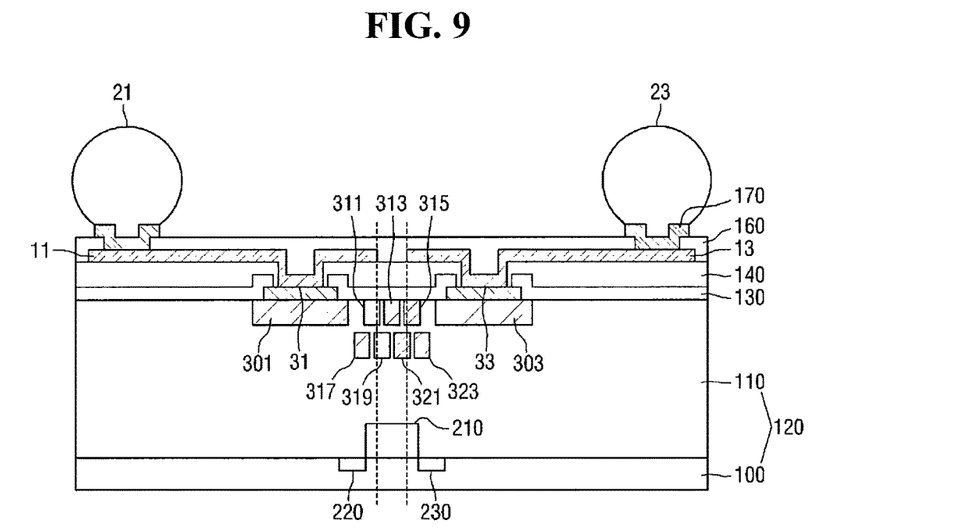
FIG. 9 is a cross-sectional view of a semiconductor device according to another example embodiment of the present inventive concepts.

FIG. 9 is a cross-sectional view of a semiconductor device according to another example embodiment of the present inventive concepts.

Referring to FIG. 9, the current embodiment is different from the embodiment of FIG. 8 in that a mesh 311 through 323 including a plurality of metal wiring layers is formed between a gate structure 210 and redistribution layers 11 and 13. Like the metal wiring layer 305, the mesh 311 through 323 may reduce or prevent a change in charge mobility due to the vertical positional relationship between the gate structure 210 and the redistribution layers 11 and 13. In some example embodiments of the present inventive concepts, the mesh 311 through 323 may include a plurality of metal wiring layers, each formed as a single layer or may include a single metal wiring layer or a plurality of metal wiring layers, each consisting of a plurality of stacked layers.

Figure 10:
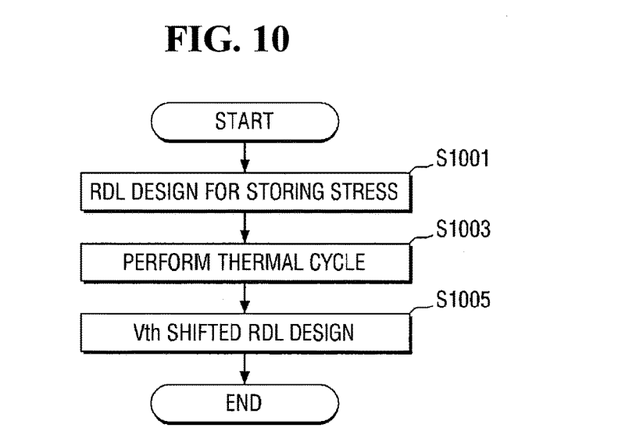
FIG. 10 is a flowchart illustrating a method of manufacturing a semiconductor device according to an example embodiment of the present inventive concepts.

FIG. 10 is a flowchart illustrating a method of manufacturing a semiconductor device according to an example embodiment of the present inventive concepts.

Referring to FIG. 10, in the method of manufacturing a semiconductor device according to the current embodiment, a redistribution layer is designed to apply stress through thermal expansion (operation S1001), and a package is formed on a wafer having a plurality of ICs. In this case, the package may be formed by a WLP process. Next, a heat treatment process is performed before the packaged wafer is divided into individual semiconductor chips (operation S1003). The heat treatment process may be performed once, twice, or a number of times as desired. As a result, a semiconductor chip having current-voltage characteristics (such as charge mobility or threshold voltage) of a transistor changed is obtained (operation S1005).

Specifically, in the method of manufacturing a semiconductor device according to the current embodiment, a plurality of semiconductor chips are formed in a wafer, and a wafer level package is formed for the semiconductor chips. Then, charge mobility in a channel of a transistor included in each of the semiconductor chips is simultaneously adjusted by performing a heat treatment process on the wafer level package. Here, each of the semiconductor chips includes a first redistribution layer formed on a top surface thereof and a second redistribution layer separated from the first redistribution layer. A gate structure that forms the transistor in each of the semiconductor chips includes a first overlap region which is overlapped by the first redistribution layer, a second overlap region which is overlapped by the second redistribution layer, and an exposed region between the first overlap region and the second overlap region.

In some example embodiments of the present inventive concepts, the simultaneously adjusting of the charge mobility in the channel of the transistor in each of the semiconductor chips may include thermally expanding the first redistribution layer and the second redistribution layer by heat-treating the wafer level package and applying stress to the gate structure by adjusting the degree of thermal expansion of the first redistribution layer and the second redistribution layer.

In some example embodiments of the present inventive concepts, a direction in which the first redistribution layer and the second redistribution layer expand thermally may be the same as a direction of a channel formed under the gate structure.

In some example embodiments of the present inventive concepts, an insulating layer may be formed on the first redistribution layer and the second redistribution layer. The insulating layer may have a smaller CTE than the first redistribution layer and the second redistribution layer. The thermally expanding of the first redistribution layer and the second redistribution layer by heat-treating the wafer level package may include thermally expanding the first redistribution layer, the second redistribution layer, and the insulating layer.

In some example embodiments of the present inventive concepts, the applying of stress to the gate structure by adjusting the degree of thermal expansion of the first redistribution layer and the second redistribution layer may further include causing the first redistribution layer and the second redistribution layer to be curved toward the gate structure using a difference between the degree of thermal expansion of the first and second redistribution layers and the degree of thermal expansion of the insulating layer.

What is claimed is:

1. A semiconductor device, comprising:
a semiconductor chip, including,
at least one gate structure on a substrate, the gate structure including a first region, a second region different from the first region, and a third region between the first and second regions;
a first redistribution layer on a top surface of the semiconductor chip, the first redistribution layer configured to electrically connect a first electrode pad of the semiconductor chip to a first solder ball, the first redistribution layer overlapping the first region of the gate structure;
a second redistribution layer on the top surface of the semiconductor chip, the second redistribution layer configured to electrically connect a second electrode pad of the semiconductor chip to a second solder ball, the second redistribution layer overlapping the second region of the gate structure such that the third region is exposed; and
an insulating layer on the first redistribution layer and the second redistribution layer.

2. The semiconductor device of claim 1, wherein coefficients of thermal expansion (CTEs) of the first redistribution layer and the second redistribution layer are different from a CTE of the insulating layer.

3. The semiconductor device of claim 1, wherein
the semiconductor chip comprises a channel under the gate structure; and
the first redistribution layer and the second redistribution layer expand thermally in a same direction as the channel.

4. The semiconductor device of claim 3, wherein
the semiconductor chip comprises a transistor on the gate structure; and
a charge mobility of the channel of the transistor varies according to a degree of thermal expansion of the first redistribution layer and the second redistribution layer.

5. The semiconductor device of claim 4, wherein a threshold voltage of the transistor varies according to the degree of thermal expansion of the first redistribution layer and the second redistribution layer.

6. The semiconductor device of claim 1, wherein
the semiconductor chip further comprises a power management integrated circuit (PMIC), the PMIC including a power supply circuit configured to generate an output voltage to be applied to other chips using a transistor including the gate structure, and
the output voltage of the PMIC varies according to a degree of thermal expansion of the first redistribution layer and the second redistribution layer.

7. The semiconductor device of claim 6, wherein
the transistor is one of a P-type transistor and an N-type transistor, and
the output voltage of the PMIC varies according to the degree of thermal expansion of the first redistribution layer and the second redistribution layer.

8. The semiconductor device of claim 1, wherein the first redistribution layer and the second redistribution layer are curved in one of a convex shape and a concave shape with respect to the gate structure.

9. The semiconductor device of claim 1, wherein the semiconductor chip further comprises:
at least one metal wiring layer between the gate structure and the first and second redistribution layers, the metal wiring layer configured to reduce stress delivered to the gate structure from the first redistribution layer and the second redistribution layer.

10. The semiconductor device of claim 9, wherein the metal wiring layer is a plurality of metal wiring layers forming a mesh.

11. A semiconductor device, comprising:
a semiconductor chip including,
at least one first gate structure and a second gate structure on a substrate extending along a first direction, the first gate structure having a top surface including a first overlap region, a second overlap region different from the first overlap region and a third overlap region between the first and second overlap regions;
a first redistribution layer covering the first overlap region in a second direction perpendicular to the first direction; and
a second redistribution layer covering an entire top surface of the second gate structure and the second overlap region in the second direction such that the third overlap region is exposed.

12. The semiconductor device of claim 11, further comprising:
a first transistor including the first gate structure; and
a second transistor including the second gate structure,
wherein the first transistor is configured to change a threshold voltage thereof according to a thermal expansion of the first redistribution layer and a thermal expansion of the second redistribution layer, and the second transistor is configured to not change a threshold voltage thereof according to the thermal expansion of the first redistribution layer and the thermal expansion of the second redistribution layer.

13. The semiconductor device of claim 11, further comprising:
an insulating layer on the first redistribution layer and the second redistribution layer,
wherein the first redistribution layer and the second redistribution layer expand thermally to a different degrees from the insulating layer.

14. The semiconductor device of claim 13, wherein
the first redistribution layer and the second redistribution layer are configured to curve in a third direction perpendicular to the first direction and the second direction according to a difference between a degree of thermal expansion of the first and second redistribution layers and a degree of thermal expansion of the insulating layer, and
the curved first and second redistribution layers apply stress to the first gate structure.

15. The semiconductor device of claim 11, wherein a width of the exposed third overlap region in the second direction is smaller than a width of the top surface of the first gate structure in the second direction.

* * * * *